United States Patent
Morin et al.

(10) Patent No.: US 9,099,559 B2
(45) Date of Patent: Aug. 4, 2015

(54) METHOD TO INDUCE STRAIN IN FINFET CHANNELS FROM AN ADJACENT REGION

(71) Applicant: STMicroelectronics, Inc., Coppell, TX (US)

(72) Inventors: Pierre Morin, Albany, NY (US); Nicolas Loubet, Guilderland, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/027,758

(22) Filed: Sep. 16, 2013

(65) Prior Publication Data

US 2015/0076514 A1    Mar. 19, 2015

(51) Int. Cl.
| | |
|---|---|
| *H01L 21/70* | (2006.01) |
| *H01L 29/78* | (2006.01) |
| *H01L 29/16* | (2006.01) |
| *H01L 29/66* | (2006.01) |

(52) U.S. Cl.
CPC ............ *H01L 29/7843* (2013.01); *H01L 29/16* (2013.01); *H01L 29/1608* (2013.01); *H01L 29/66795* (2013.01); *H01L 29/785* (2013.01)

(58) Field of Classification Search
CPC ... H01L 29/16; H01L 29/1608; H01L 29/785; H01L 16/66795; H01L 29/7873
See application file for complete search history.

(56) References Cited

U.S. PATENT DOCUMENTS

| | | | |
|---|---|---|---|
| 2005/0145941 A1* | 7/2005 | Bedell et al. | 257/348 |
| 2009/0001415 A1* | 1/2009 | Lindert et al. | 257/190 |
| 2012/0171832 A1* | 7/2012 | Toh et al. | 438/300 |
| 2013/0200468 A1* | 8/2013 | Cai et al. | 257/401 |

OTHER PUBLICATIONS

Loubet et al., U.S. Appl. No. 13/964,009, filed Aug. 9, 2013.

* cited by examiner

*Primary Examiner* — Benjamin Sandvik
*Assistant Examiner* — Farid Khan
(74) *Attorney, Agent, or Firm* — Allen, Dyer, Doppelt, Milbrath & Gilchrist, P.A.

(57) ABSTRACT

Methods and structures for forming strained-channel finFETs are described. Fin structures for finFETs may be formed using two epitaxial layers of different lattice constants that are grown over a bulk substrate. A first thin, strained, epitaxial layer may be cut to form strain-relieved base structures for fins. The base structures may be constrained in a strained-relieved state. Fin structures may be epitaxially grown in a second layer over the base structures. The constrained base structures can cause higher amounts of strain to form in the epitaxially-grown fins than would occur for non-constrained base structures.

12 Claims, 14 Drawing Sheets

METHOD TO INDUCE STRAIN IN FINFET CHANNELS FROM AN ADJACENT REGION

BACKGROUND

1. Technical Field

The technology relates to methods to induce strain in three-dimensional microfabricated structures such as finFET structures. As an example, a type of strain (compressive or tensile) and amount of strain can be selectively induced in finFET channel structures from material and structures formed adjacent to the channel regions.

2. Discussion of the Related Art

Transistors are fundamental device elements of modern digital processors and memory devices, and have found numerous applications in various areas of electronics, including power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET).

An example of a finFET 100 is depicted in the perspective view of FIG. 1A. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 250 nanometers. There may be an insulating layer 105, e.g., an oxide layer, on a surface of the substrate. The fin may pass through the insulating layer 105, but be attached to the semiconducting substrate 110 at a lower region of the fin. A gate structure comprising a conductive gate material 130 (e.g., polysilicon) and gate insulator 135 (e.g., an oxide) may be formed over a region of the fin. Upper portions of the fin may be doped on either side of the gate structure to form a source region 120 and drain region 140 adjacent to the gate.

FinFETs have favorable electrostatic properties for complimentary MOS scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

SUMMARY

The described technology relates to methods for making strained microstructures, such as strained-channel finFETs, and to related structures. According to some embodiments, a first straining layer comprising a first material may be deposited on a substrate in a strained state. The straining layer may be cut to relieve the strain and to form strain-inducing base structures. The base structures may be subsequently constrained on at least some of their exposed surfaces with a material having a high Young's modulus, so as to substantially lock in or freeze the strain-relieved state of the base structures. A second material having a lattice mismatch with the material of the base structures may be epitaxially grown on the base structures. The second material may form in a strained state, and may be used, for example, to form channel regions of a finFET.

According to some embodiments, the straining layer may comprise a compound semiconductor (e.g., SiGe, SiC) deposited on a semiconductor substrate (e.g., Si). A second layer of material (e.g., Si) may be formed adjacent the straining layer, and a feature (e.g., a fin of a finFET) may be formed or patterned in the second layer. The adjacent second layer may be in direct physical contact with the straining layer in some embodiments, or may be separated from the straining layer by a thin layer of material in some embodiments. The straining layer may be thin (e.g., between approximately 10 nm and 60 nm in some embodiments) such that strain in the straining layer is elastic rather than plastic, so that defects are not generated at unacceptable levels in the straining layer or subsequent epitaxial layer formed over the straining layer.

According to some embodiments, a method for making a strained three-dimensional feature (e.g., a fin of a finFET) on a substrate comprises forming a first semiconductor layer in a strained state at a surface of a substrate, and cutting the first semiconductor layer to relieve strain in the first semiconductor layer and to form at least one strain-relieved structure. The method may further comprise depositing, after the cutting, a constraining material adjacent the strain-relieved structure to restrict expansion and contraction of the strain-relieved structure. The constraining material may have a Young's modulus higher in value than the Young's modulus of the strain-relieved structure. According to some embodiments, the method further comprises growing a second semiconductor layer in a strained state adjacent to a surface of the constrained, strain-relieved structure, and forming the strained three-dimensional feature in the second semiconductor layer. The second semiconductor layer may have a lattice constant that differs from that of the first semiconductor layer. When grown, e.g., by epitaxial growth, the second semiconductor layer may form in a strained state.

Structures related to the methods are also contemplated. In some embodiments, a strained-channel finFET structure formed on a substrate using methods described herein may comprise a strain-inducing base structure adjacent to a fin of the finFET structure, wherein the strain-inducing base structure is formed from a first semiconductor material having a first lattice constant that is mismatched to a second lattice constant of the fin material. The strained-channel finFET may include a fin formed from a second semiconductor material that is strained by the strain-inducing base structure, and further include a constraining material adjacent the strain-inducing base structure. The constraining material may have a Young's modulus higher than the Young's modulus of the strain-inducing base structure.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
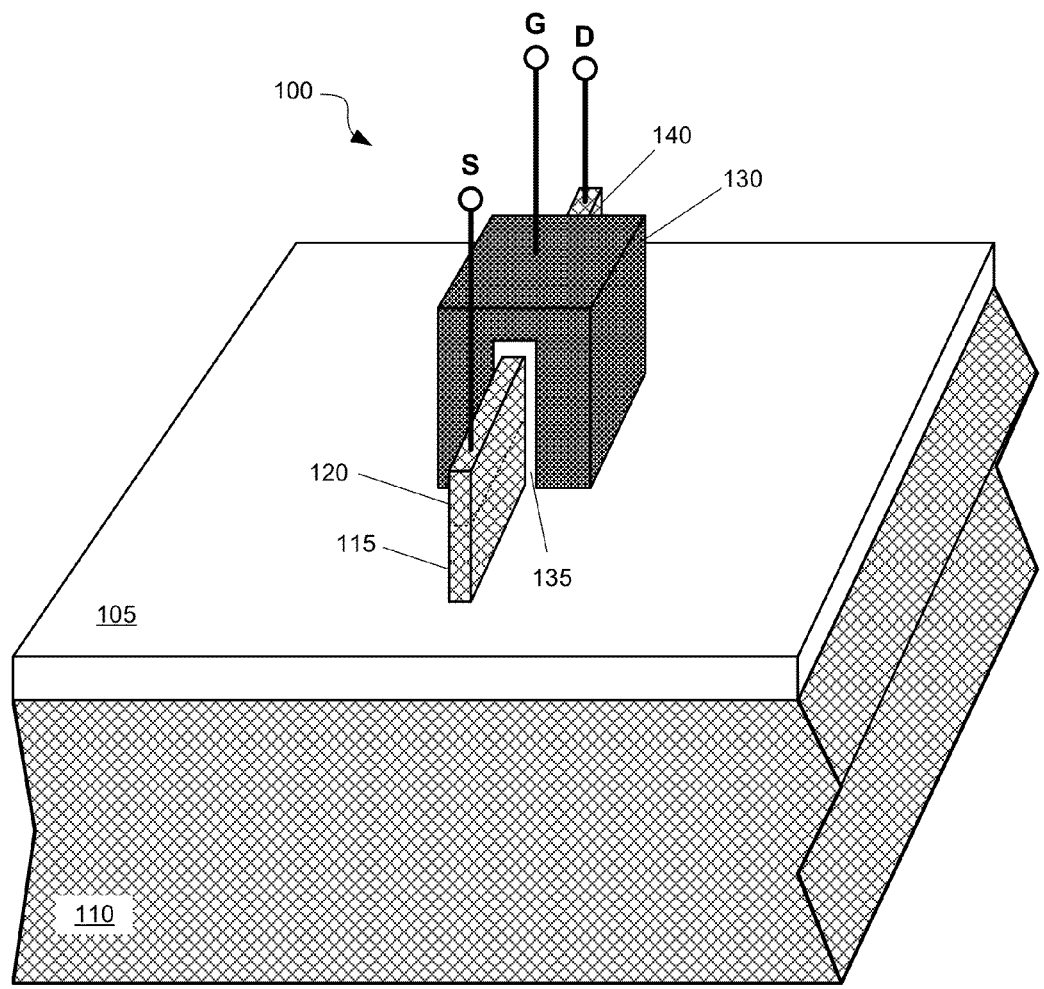
FIG. 1A is a perspective view of a finFET formed on a bulk substrate.

As noted above, finFETs exhibit favorable current-to-size switching capabilities for integrated circuits, and finFETs like those shown in FIG. 1A have been fabricated in high density on bulk silicon (Si) substrates. FinFETs also exhibit favorable electrostatic properties for scaling to high-density, low-power, integrated circuits. Because the fin and channel are raised from the substrate, the devices can exhibit reduced cross-coupling between proximal devices.

In some cases, speed, junction leakage current, and/or breakdown voltage considerations may create a need for semiconductor material other than silicon. For example, SiGe can exhibit higher mobilities for electrons and holes, higher device speed, and lower junction leakage than bulk Si. As a result, some devices may be fabricated from SiGe that is epitaxially grown on a silicon substrate. However, conventional epitaxial growth of SiGe for forming integrated devices has some attributes that may not be favorable for certain applications. For example, because of a lattice constant mismatch between SiGe and Si, strain is induced in the SiGe as it is epitaxially grown. In some cases, the strain causes defects such as dislocations to form in the SiGe during its growth, which can adversely affect device performance and degrade performance to unacceptable levels. To mitigate effects of strain, a thick epitaxial layer of SiGe may be grown so that the strain is relieved over an appreciable distance. Depending upon the dopant concentration, SiGe epitaxial layers 1-10 microns thick may be necessary to relieve the stress by full plastic relaxation. Plastic relaxation can introduce defects. Such an approach may require long and complex epitaxy steps (e.g., it may be necessary to vary dopant concentration during the epitaxial growth), and may further require a thermal annealing step and chemical-mechanical polishing step to planarize a surface of the SiGe after its growth. The annealing may reduce some defects generated during epitaxial growth of SiGe, but typically the defects may not be reduced below $10^5$ defects/cm$^2$, a level not suitable for many industrial applications.

Straining of silicon can be used to improve some of its electrical properties. For example compressive straining of silicon can improve the hole mobility within silicon. Tensile straining of Si can improve electron mobility. The inventors have recognized and appreciated that inducing strain in silicon can enable fabrication integrated electronic devices based on Si with performance that is competitive with SiGe devices. Although a SiGe compressive fin may exhibit higher hole mobility as compared with a Si compressive fin, the Si compressive fin is free of alloy scattering, an effect that can adversely affect hole transport in SiGe fins. Accordingly, a compressively-strained, Si finFET may be competitive with a compressively-strained SiGe finFET in terms of performance, and fabrication of compressive Si fins may be easier and more cost effective than fabrication of compressive SiGe fins. For smaller devices, e.g., sub-20-nm channel-width FETs such as finFETs, the avoidance of thick (>1 micron) SiGe epitaxial layers and increased device performance from strain may be important factors in the manufacturability of the strained devices.

Figure 1B:
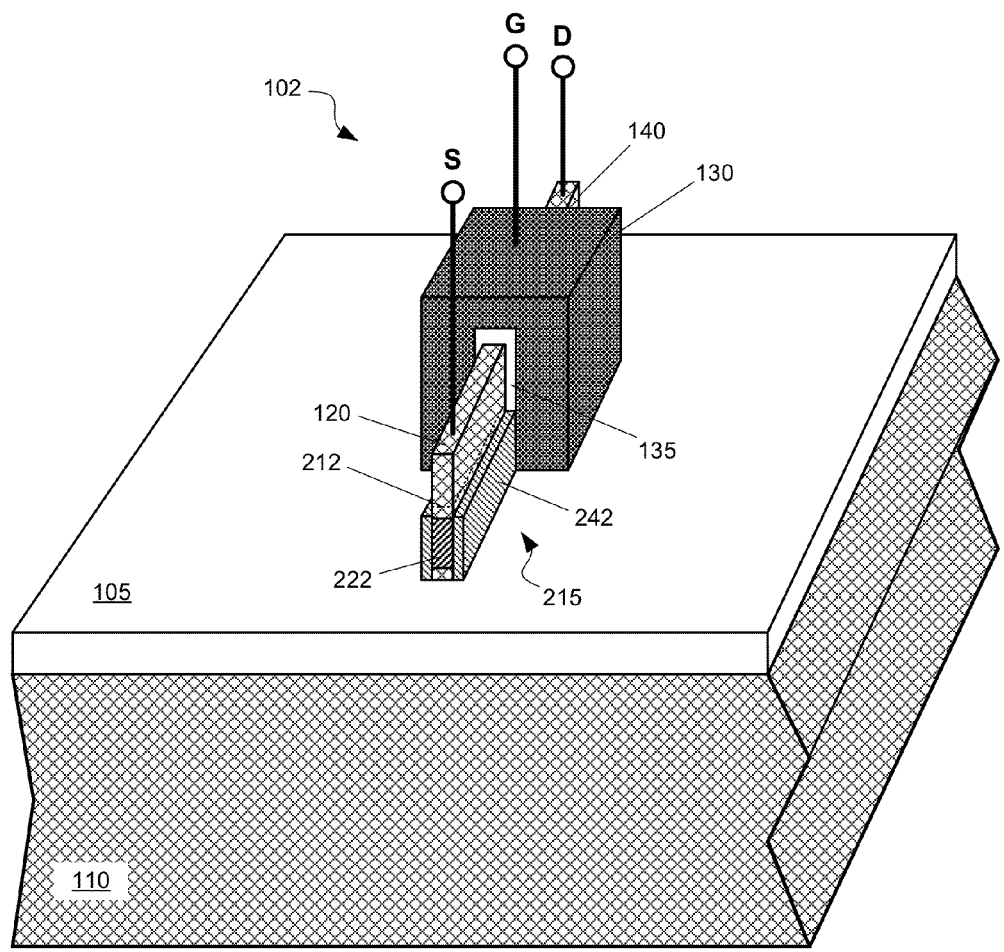
FIG. 1B is a perspective view of a strained-channel finFET, according to some embodiments.

A strained-channel finFET 102 may appear as depicted in FIG. 1B, according to some embodiments. The structure may be similar to that shown in FIG. 1A except that a portion of the fin structure 215 includes a strain-inducing base structure 222. The strain-inducing base structure may comprise a material or alloy different than the material or alloy of the fin 212 where the device's active region is located. For example, in a Si-based device, the fin 212 may be formed from bulk and/or epitaxial silicon. The strain-inducing base structure 222 may be formed from SiGe in some embodiments (e.g., to induce tensile stress in the fin and improve electron mobility in the device), or SiC in other embodiments (e.g., to induce compressive stress in the fin and improve hole mobility in the device. Constraining structures 242 may be located adjacent to the strain-inducing base structure 222. As may be appreciated, other materials exhibiting a lattice mismatch with the substrate and device layer may be used instead of SiGe or SiC, and different material systems may be used in other implementations. In some implementations, the fin structure 215 may be formed and an insulating material subsequently formed between the fin structure and substrate 110, using techniques described in U.S. patent application Ser. No. 13/964,009 titled, "BULK FINFET SEMICONDUCTOR-ON-NOTHING INTEGRATION," and filed Aug. 9, 2013, which application is incorporated by reference in its entirety.

FIGS. 2A-2L depict process steps that may be used to fabricate strained-channel finFET devices beginning with a bulk semiconductor substrate. In overview, the active regions of the fins may be formed from epitaxially-grown semiconductor of high quality (e.g., epitaxial Si in the example). The fins may be epitaxially grown on a strain-inducing base structure 222 of a second material type, which may be epitaxially grown on a substrate 110. The base structures 222 may be formed from a straining layer 220 which, because of a lattice mismatch with the substrate, epitaxially grows in a strained state. When a base structure 222 is cut or formed in the straining layer 220, the strain will be relieved locally at the base structure. The strain-relieved base structure can be constrained in this state by forming a material 242 with a high Young's modulus to partially encapsulate the base structure. Subsequent epitaxial growth and formation of a fin 212, of a different material than the base structure, on the constrained base structure can impart stress on the order of $10^9$ Pascals or more to an active region of the fin. Since the formation of the strain-inducing base structure, its relaxation, and subsequent formation of the fin may be in a purely elastic regime, there may be no appreciable defects generated in the strain-inducing base structure 222 and/or the epitaxially grown fin 212, as would be generated from thicker layers that may suffer from plastic deformation and relaxation, for example. Further details regarding device fabrication are described below.

Figure 2A:
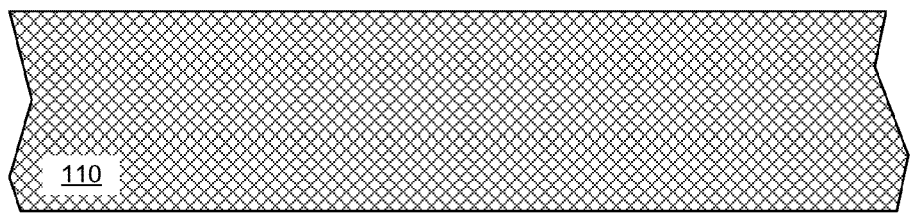
FIGS. 2A-2L depict process steps and structures associated with methods for forming strained fin structures, according to some embodiments.

According to some embodiments, a process for forming a strained-channel finFET may begin with a substrate 110 of a first semiconductor material, as depicted in FIG. 2A. The substrate may be a semiconducting substrate (e.g., a bulk Si substrate), though other semiconducting materials may be used in other embodiments. In some embodiments, the substrate may comprise a silicon-on-insulator (SOI) substrate. The substrate may be of p-type conductivity or of n-type conductivity.

Figure 2B:
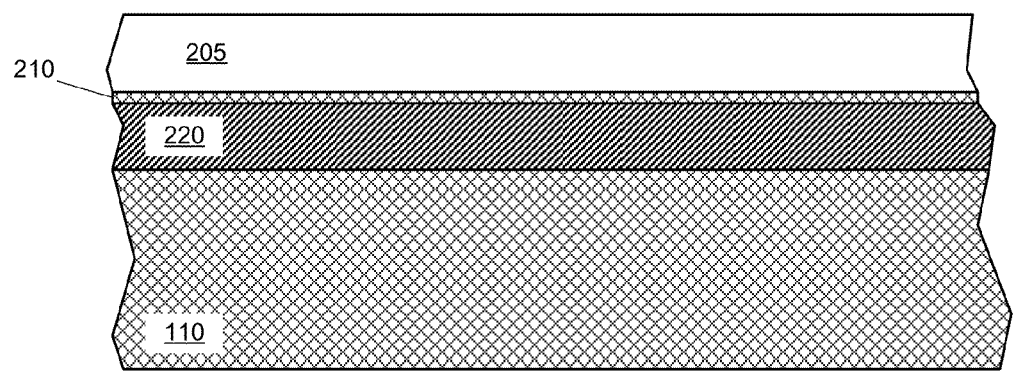

With reference to FIG. 2B, at a region where fins for finFETs are to be formed, additional layers may be formed on the substrate surface. For example, a straining layer 220 may be formed over the substrate 110. In some embodiments, for a Si substrate, a SiGe straining layer 220 may be epitaxially grown on the substrate 110. A thin buffer or seed layer 210 (e.g., a thin Si layer) may be epitaxially grown on the straining layer 220, and a "soft" layer 205 may be formed over the buffer layer 210. In various embodiments, there is a lattice mismatch between the straining layer and the substrate, so that the straining layer forms with compressive or tensile, in-plane stress. Further there may be a lattice mismatch between the straining layer 220 and the seed layer 210. In some embodiments, the seed layer may be omitted.

According to some embodiments, the straining layer 220 comprises SiGe and may have a thickness between about 10 nm and about 60 nm. In some embodiments, the straining layer 220 may be a "full sheet" layer (e.g., extending uniformly across the entire surface of the substrate 110). The percentage concentration of Ge in the straining layer may be between about 1% and about 50%. The concentration of Ge and the thickness of the straining layer may be selected to impart a desired amount of strain to a structure formed over the straining layer. In some implementations, the dopant concentration of Ge in the straining layer may depend upon a thickness of the straining layer. For example, a higher dopant concentration may be used in thinner layers. The dopant concentration may be selected such that defect densities generated by the strain are below a desired value. According to some embodiments, a straining layer that is approximately 30 nm thick may have a Ge concentration of about 30%, whereas a straining layer that is approximately 40 nm thick may have a Ge concentration of about 25%. In some implementations, a straining layer may have a thickness up to about 60 nm with a Ge concentration of about 25%, without exceeding acceptable defect levels. The straining layer 220 may be formed by chemical vapor deposition, atomic layer deposition, or any other suitable crystal-growth process.

In some embodiments, the straining layer may comprise SiC, and may have a thickness between about 5 nm and about 60 nm. The percentage concentration of C in the straining layer may be between about 1% and about 50%. Other materials may be used for the straining layer 220 in other embodiments.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

In various embodiments, the straining layer is formed by epitaxial growth, so as to form a crystalline layer with low defect concentration. By limiting the alloy concentration and thickness of the straining layer 220, the layer may form in a strained state in which all strain is purely elastic. As such, the strain may induce few defects in the straining layer. For example, the straining layer may have a defect density less than $10^5$ defects/cm$^2$ in some embodiments, less than $10^4$ defects/cm$^2$ in some embodiments, less than $10^3$ defects/cm$^2$ in some embodiments, less than $10^2$ defects/cm$^2$ in some embodiments, and yet less than less than 10 defects/cm$^2$ in some embodiments. By controlling the epitaxial growth conditions for the straining layer 220, the crystalline quality of a subsequently grown seed layer 210 or device layer in which an active structure is formed may be high with as few or fewer defects than the straining layer.

In some embodiments, a processing thermal budget may be controlled after formation of the straining layer, so as to avoid unwanted mechanical relaxation of the straining layer and formation of dislocations in the straining layer, and to avoid diffusion of the dopant (Ge or C, for example) of the straining layer to the device region (e.g., into the channel region of the finFET). For example, a 1000° C., 30-minute bake may be unacceptable thermal processing, whereas a spike anneal to a temperature of 1040° C. at a ramping rate of 75° C./sec with no plateau would be sufficient to activate the dopant without unacceptable adverse effects of dislocations or dopant diffusion.

According to some embodiments, the seed layer 210 forms a layer upon which fins for strained-channel finFETs may be formed. In some embodiments, the semiconductor material of the seed layer 210 may be different than the semiconductor material of the substrate. In other embodiments, the semiconductor material of the seed layer 210 may be the same as the semiconductor material of the substrate. The thickness of the seed layer may be between about 1 nm and about 10 nm in some embodiments. The seed layer 210 may be formed by chemical vapor deposition, atomic layer deposition, or a suitable crystal-growth process.

The soft layer 205 may comprise a material that has a Young's modulus less than that for the straining layer 220, e.g., less than about 20 GPa in some embodiments, less than about 10 GPa in some embodiments, and yet less than about 5 GPa in some embodiments. In some implementations, the soft layer may comprise an oxide, e.g., SiO$_2$. The Young's modulus of the soft layer may be less than the Young's modulus of the straining layer by a factor of more than 2 in some embodiments, by a factor of more than 4 in some embodiments, by a factor of more than 8 in some embodiments, an yet by a factor of more than 20 in some embodiments. The thickness of the soft layer 205 may be between about 5 nm and about 100 nm. In some embodiments, the soft layer may exhibit etch selectivity over the seed or buffer layer 210 and the straining layer 220.

Figure 2C:
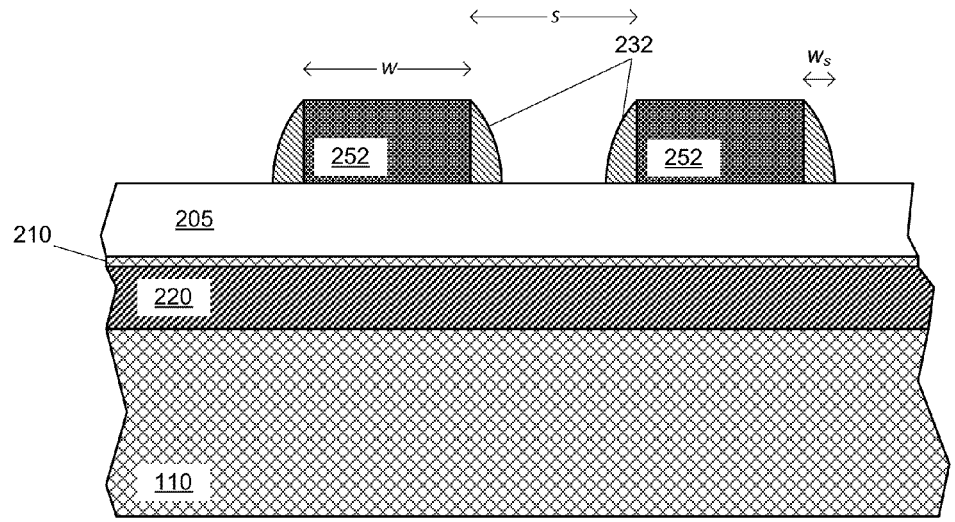
Figure 2D:
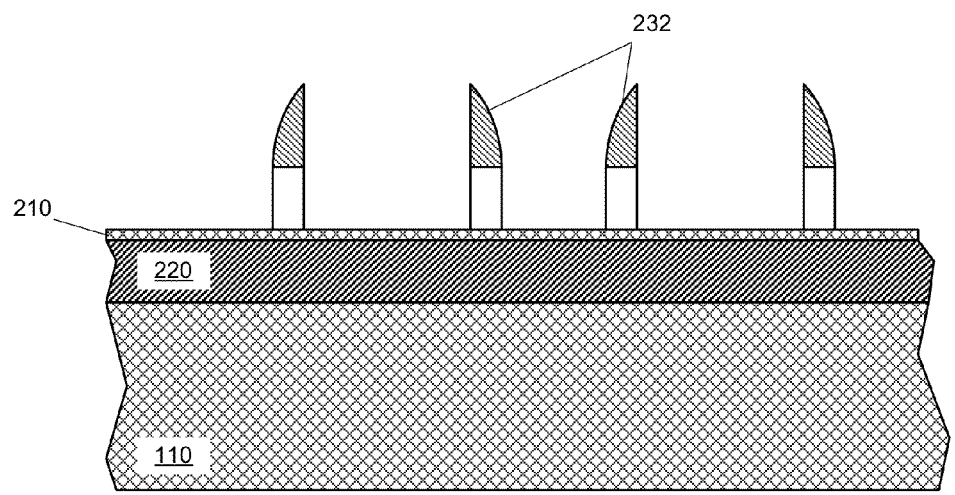
Figure 2E:
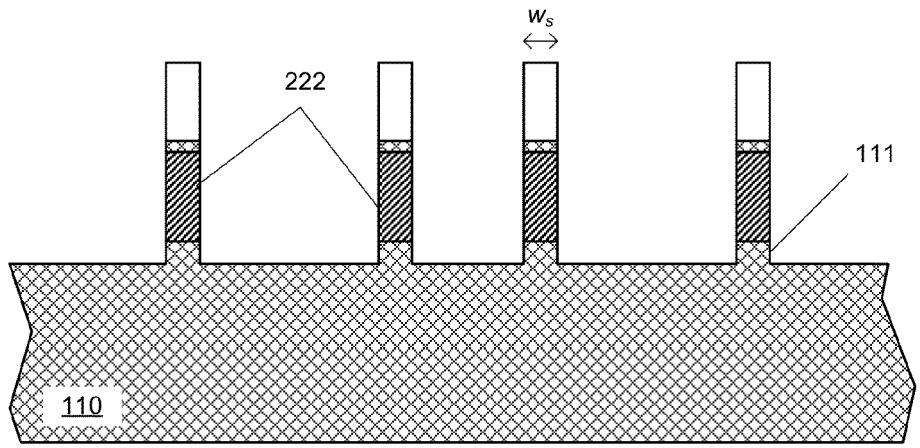

Strain-inducing base structures may be patterned in the straining layer 220 by a sidewall image transfer (SIT) process that is depicted by steps illustrated in FIGS. 2C-2E. For this process, additional layers may be deposited and patterned over the epitaxial layers and soft layer, as indicated in FIG. 2C. Bar-like structures 252 may be formed in a patterning layer deposited over the soft layer using any suitable method, e.g., photolithography and etching. The photolithography may require forming a photoresist layer over the patterning layer, exposing and developing the photoresist, and etching the patterning layer to form the bar structures 252. In some embodiments, the bar-like structures may be patterned using a mandrel lithography process. In some implementations, the bar-like structures may be patterned using interferometric lithography techniques. The bar-like structures 252 may be patterned to extend for a length L (into the page) that is approximately a desired length for a fin of a finFET transistor. The width W and spacing S of the bar-like structures may be chosen to provide desired spacings between multiple fins of a finFET device or between multiple finFET devices.

A blanket layer (not shown) may be deposited over the bar-like structures 252 and soft layer 205. In some embodiments, the blanket layer may comprise silicon nitride that is deposited by a plasma deposition process. The thickness of the blanket layer may be between 50 nm and 100 nm in some embodiments, between 5 nm and 50 nm in some embodiments, and in some embodiments may be between about 5 nm and about 20 nm. The blanket layer may form conformally on the sidewalls of the bar structures 252. The blanket layer may be etched away from planar surfaces and partially etched on the vertical surfaces to form spacer structures 232, as depicted in FIG. 2C. The thickness of the blanket layer may then determine approximately a width $w_s$ of the spacer structures 232, and subsequent widths of fin structures. A series of etching steps may then be used to pattern the strain-inducing base structures in the straining layer 220, where the spacer structures 232 substantially define the pattern of the strain-inducing base structures.

For example, a first selective, anisotropic etch may be performed to remove the bar-like structures 252. The same etch recipe, or a different etch recipe may be used to remove most of the soft layer 205, thereby transferring the pattern of the spacer structures 232 to the soft layer. The resulting structure may appear as depicted in FIG. 2D. A second selective, anisotropic etch may be performed to remove exposed portions of the seed layer 210 and straining layer 220, thereby transferring the pattern from the soft layer to the seed layer and straining layer so as to form the strain-inducing base structures 222. In some embodiments, the spacer structures 232 may etch away during etching of the seed layer and straining layer to yield a structure like that depicted in FIG. 2E. In some implementations, the spacer structures may be removed by a dedicated etch.

In some embodiments, there may be additional etching into the substrate 110, as depicted in FIG. 2E. For example, the etching may extend between 5 nm and 50 nm into the substrate 110. By etching into the substrate, a small pedestal 111 under the strain-inducing base structure 222 may be formed. This pedestal may facilitate strain relief in the base structure 222, and increase an amount of strain developed in a subsequently-grown fin structure. In some implementations, the etching may stop at approximately the original surface of the substrate 110.

As noted above, the straining layer 220 forms in a strained state during its epitaxial growth due to a lattice mismatch between the material used for the straining layer and the substrate. As an example, a SiGe straining layer will form with compressive strain when grown on a bulk Si substrate. The amount of strain in the SiGe layer can be controlled by controlling the Si:Ge ratio and controlling the thickness of the straining layer. The etching to form the base structures 222 and pedestal 111, the soft layer material, and, in some cases, removal of the spacer structures 232 allows the base structures to relax so as to relieve strain. Because the soft layer 205 has a lower Young's modulus, most of the strain in the base structures is relieved. In some embodiments, the release of strain in the base structures may be purely elastic, such that no appreciable defects are generated. Because the base structures may be narrow and long, the release of strain is substantially uniaxial (e.g., longitudinal along the length of the base structure 222).

Figure 2F:
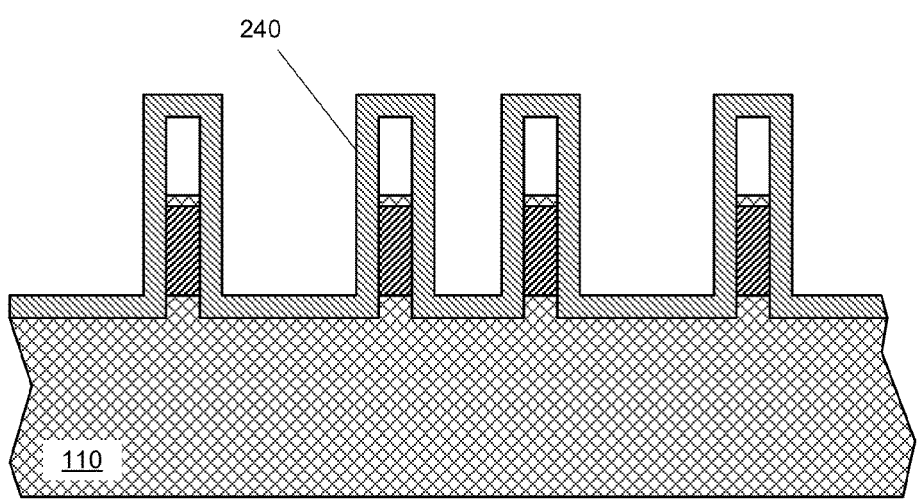

A constraining layer 240 may be deposited over the base structures 222, as depicted in FIG. 2F, so as to partially encapsulate and constrain the base structures in the strain-relieved state. The constraining layer 240 may have a Young's modulus that is greater than 50 Gpa in some embodiments, greater than 100 Gpa in some embodiments, and yet greater than 200 Gpa in some embodiments. According to some embodiments, the constraining layer comprises a nitride, e.g., $Si_3N_4$. The constraining layer may be deposited using any suitable conformal deposition process. The thickness of the constraining layer may be between about one-half the width $w_s$ of the base structure and about twice the width of the base structure 222. According to some embodiments, the thickness of the constraining layer is about equal to the width $w_s$ of the base structure, so as to provide sufficient rigidity to hold the base structure 222 in a stress-relieved state. By holding the base structure 222 in a stress-relieved state, a majority of stress is developed in a fin structure subsequently grown on the base structure.

Figure 2G:
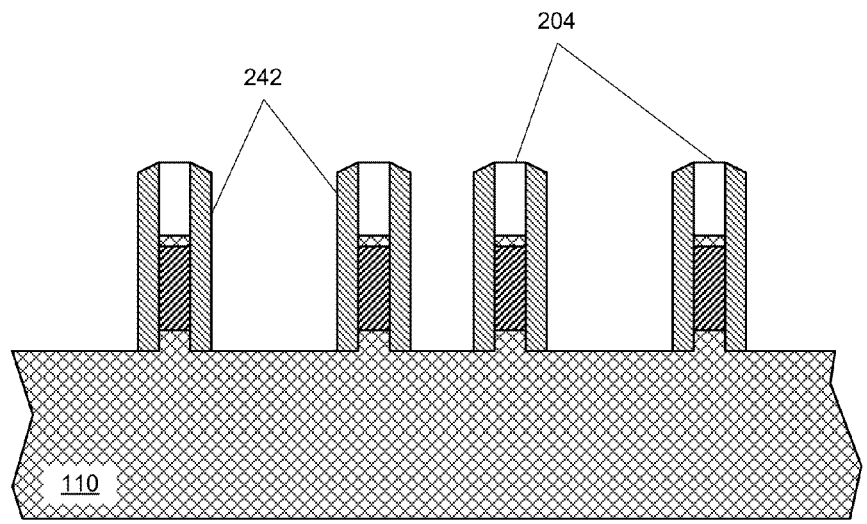

The constraining layer 240 may then be etched using an anisotropic etch, so as to form constraining structures 242 adjacent the strain-inducing base structures 222, as illustrated in FIG. 2G. The anisotropic etch may remove portions of the constraining layer 240 over the base structures 222, so as to expose cap portions 204 of the soft layer, and may remove portions extending across a surface of the substrate adjacent to the base structures.

Figure 2H:
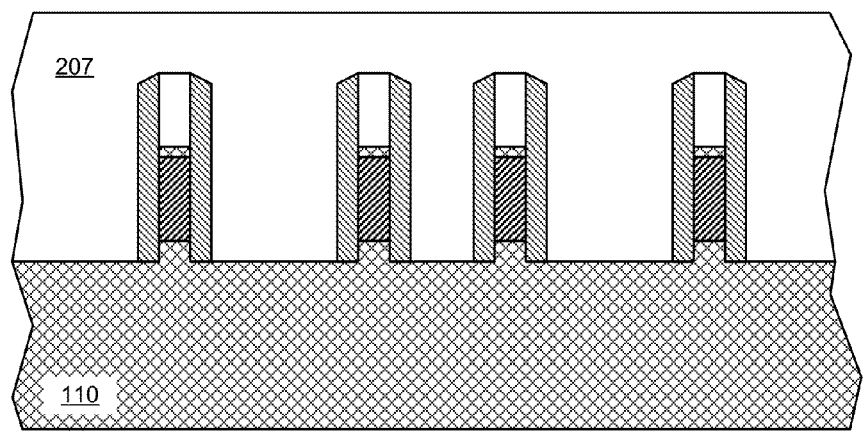
Figure 2I:
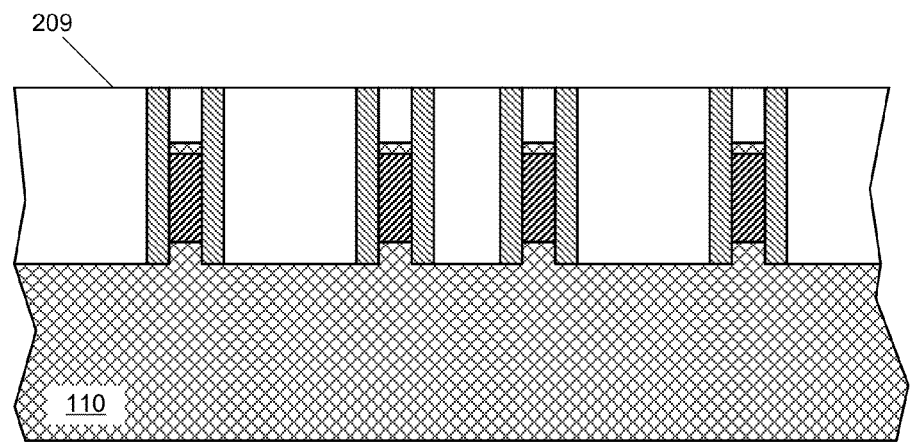

An insulating layer 207 may then be deposited over the base structures and constraining structures, as depicted in FIG. 2H. The insulating layer may be deposited by any suitable process, and in some embodiments may be a spin-on glass that is subsequently baked. The insulating layer 207 may be etched back (using a chemical-mechanical polishing (CMP) step, for example) so as to planarize the upper surface 209 and expose the remaining cap portions 204 of the soft layer, as depicted in FIG. 2I. The removal of the insulating layer 207 may stop on the constraining structures 242, and may remove a portion of the constraining structures.

Figure 2J:
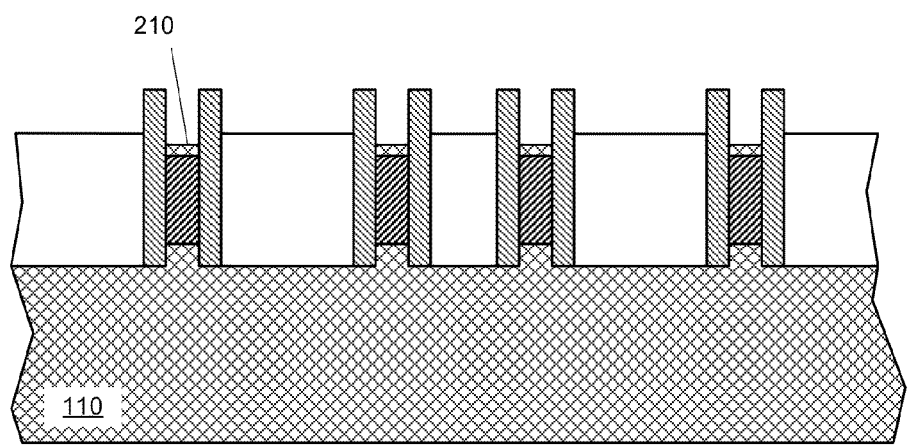

The cap portions 204 of the soft layer, and insulating layer 207 in some cases, may be etched using an anisotropic etch to expose the seed layer 210, as depicted in FIG. 2J, though other etching techniques may be used. In some embodiments, isotropic etching may be used. In some implementations, a wet etch may be used to expose the seed layer 210. The etch rates of the cap portions 204 of the soft layer and the insulating layer 207 may be different.

Figure 2K:
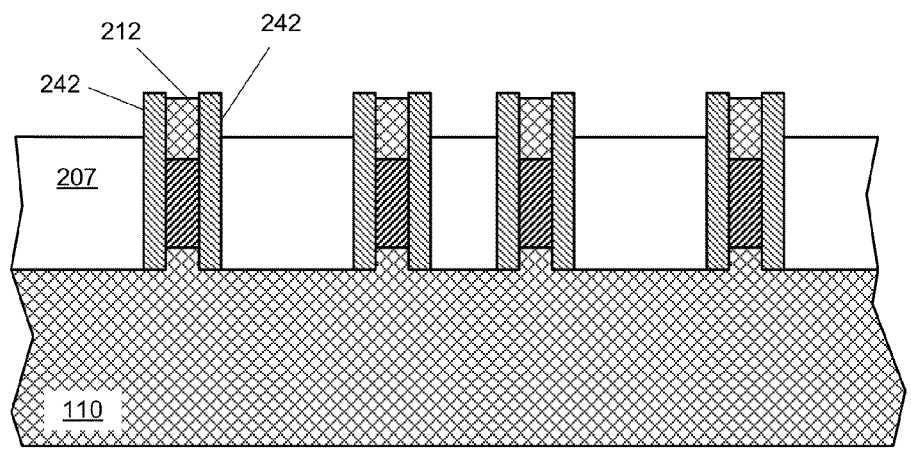

After exposure of the seed layer, fins 212 may be epitaxially grown as depicted in FIG. 2K. Since the strain-inducing base structures 222 have been substantially constrained by the constraining structures 242, they cannot absorb appreciable strain as the fins 212 grow. As a consequence, the fins 212 receive most of the strain due to the lattice mismatch between the base structure material and the fin material, and the amount of strain imparted to the fins 212 can be a factor of two higher than would be imparted if the base structures 222 were not constrained and were allowed to absorb some of the strain.

Figure 2L:
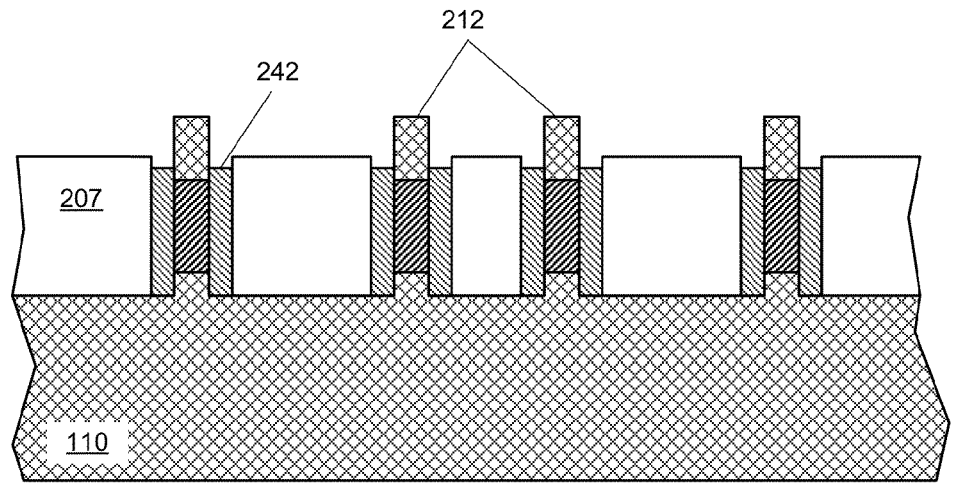

According to some embodiments, the constraining structures 242 may be etched back, as depicted in FIG. 2L, so as to expose the fin 212 for subsequent processing that will produce a finFET as depicted in FIG. 1B. According to some embodiments, the etch back of the constraining structures 242 may reduce the tops of the constraining structures to a level approximately equal with the base of the fins 212, although the tops of the constraining structures may be slightly above or below the base of the fin. The insulating material 207 may or may not be etched back further.

Figure 2M:
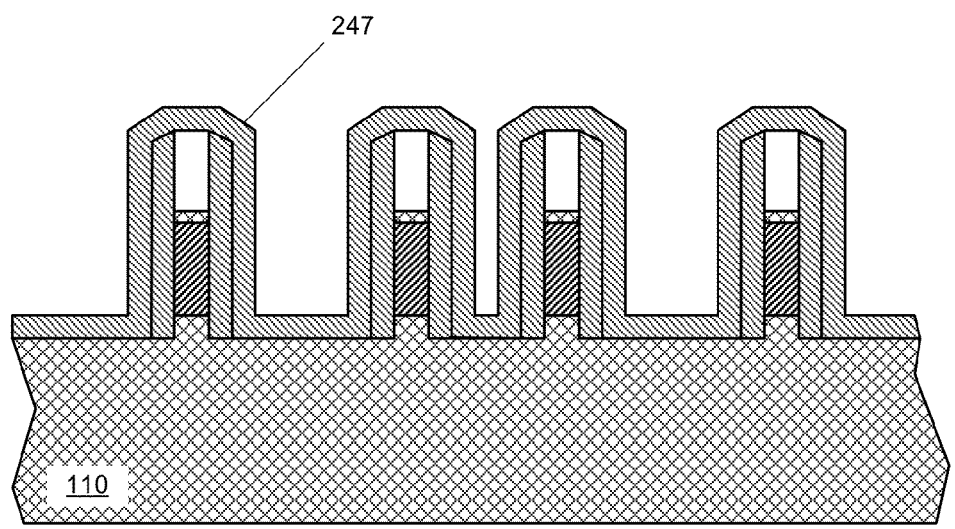
FIGS. 2M-2S depict alternative process steps and structures associated with methods for forming strained fin structures, according to some embodiments.
Figure 2N:
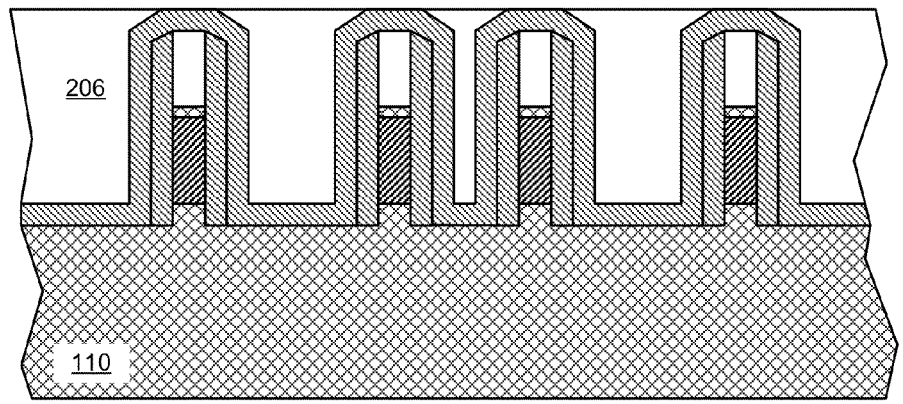

FIGS. 2M-2S depict an alternative embodiment of a process for fabricating strained fin structures. The embodiment shown in these figures may depart from the previously-described embodiment after forming a structure depicted in FIG. 2G. According to some embodiments, a second nitride layer 247 may be formed as depicted in FIG. 2M over the constraining structures 242 and base structures 222 of FIG. 2G. The second nitride layer may be formed using a vapor deposition process or any suitable conformal deposition process. In some embodiments, a material other than nitride may be used (e.g., a material exhibiting etch selectivity over oxide). An insulating material 206 (e.g., $SiO_2$) may be deposited on the substrate and planarized, as illustrated in FIG. 2N. The insulating material may exhibit etch selectivity over the nitride layer 247. Planarization may be done via chemical-mechanical polishing, and may stop on the nitride layer 247, according to some embodiments.

Figure 2O:
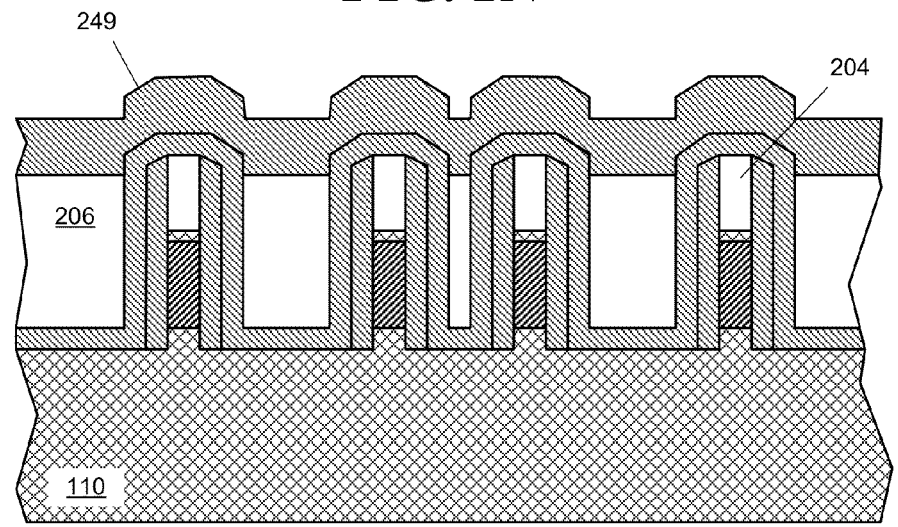

Subsequent the planarization, the insulating material 206 may be etched back using a anisotropic etching process (e.g., a SiCoNi etching step or reactive-ion etching step). The etch may reduce the height of the insulating material 206 to a level below the top surface of the cap portions 204, as depicted in FIG. 2O. A hard mask material 249 (e.g., a nitride) the exhibits etch selectivity over the insulating material 206 may then be deposited, as depicted in FIG. 2O. The mask material 249 may be deposited by any suitable deposition process, e.g., evaporation, plasma deposition, vapor phase deposition, or sputtering.

Figure 2P:
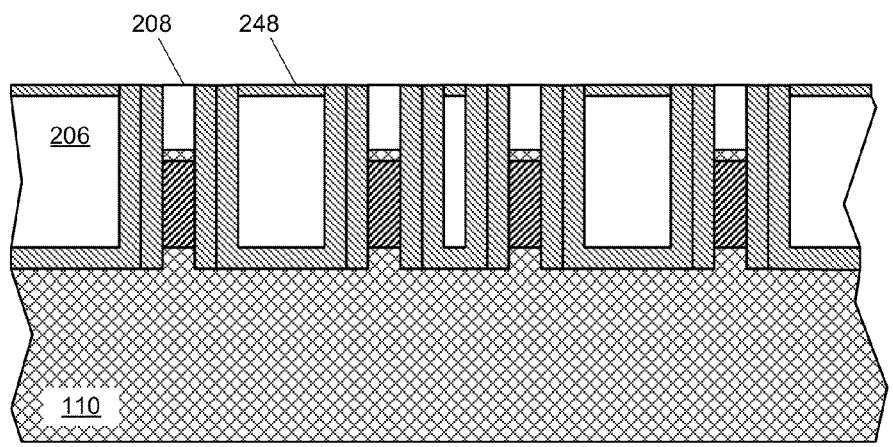
Figure 2Q:
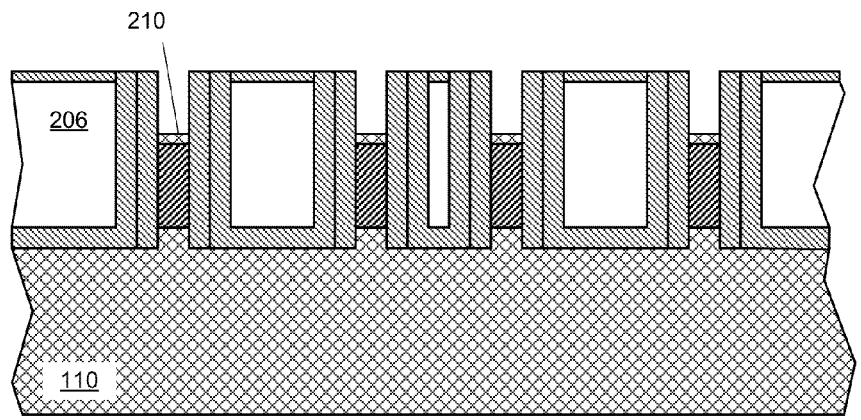

The hard mask material 249 may be planarized, e.g., via a CMP process, stopping on the cap portions 204, as depicted in FIG. 2P. Some of the cap portions 204 may be removed during the CMP step. A portion of the hard mask material 249 may remain as masking features 248 over the insulating material 206, whereas an upper surface 208 of the cap portions may be exposed for a subsequent etch. The cap portions 204 may then be etched away (e.g., using reactive ion etching or a SiCoNi etching process) to expose the underlying seed layer 210, as depicted in FIG. 2Q.

Figure 2R:
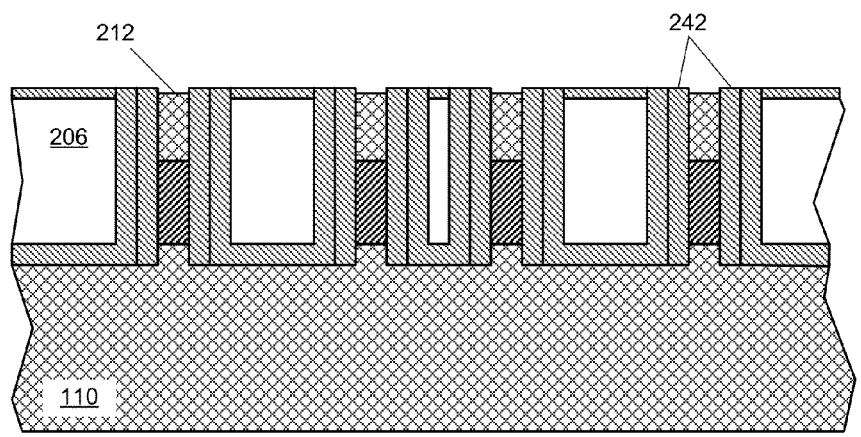
Figure 2S:
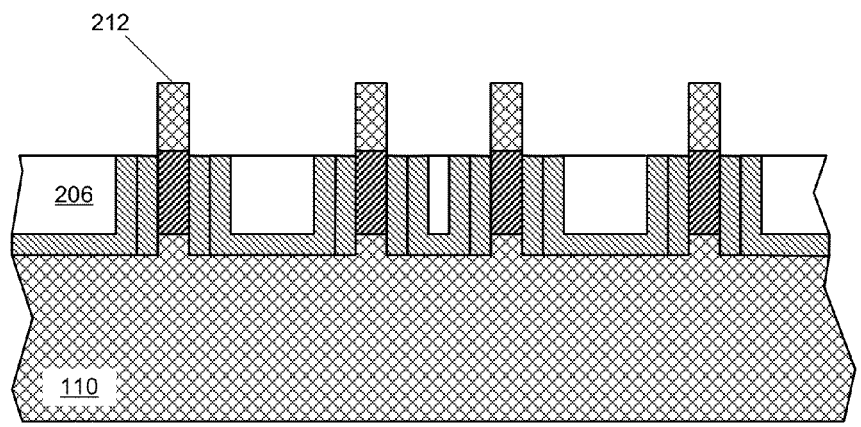

Fin structures 212 may then be epitaxially grown on the seed layers as illustrated in FIG. 2R. The constraining structures 242 provide a form that substantially determines the shape of the fin structures. The fin structures may be grown to a selected height. The substrate may then be subjected to etching to remove a portion of the hard mask material 247 and a portion of the insulating material 206, so as to expose the fin structures 212, as depicted in FIG. 2S. In some embodiments, a wet etch (e.g., an wet etch in heated phosphoric acid) may be used to remove a portion of the hard mask material 247 and a portion of the constraining structures 242. The wet etch may be a timed etch, stopping at approximately a base or bottom of the fin structure 212. In some embodiments, the wet etch may stop above the base of the fin structure. In another embodiment, the wet etch may stop below the base of the fin structure 212. The insulating material 206 may then be etched back to approximately the base of the fin structure, e.g., using a SiCoNi process or other suitable reactive-ion etching process.

The process steps described in connection with FIGS. 2M-2S yield a structure different from an alternative method described in connection with FIGS. 2H-2L. For the steps shown in FIGS. 2M-2S, there is an interfacial hard mask layer between the substrate 110 and the remaining insulating material 206. This interfacial layer is not present in the alternative process, and its presence or absence may distinguish between the two processes. The steps associated with FIGS. 2M-2S may provide additional mechanical support to the fin structures, and allow additional cleaning (e.g., via HF etching) of the seed layer prior to epitaxial growth of the fin.

Figure 2T:
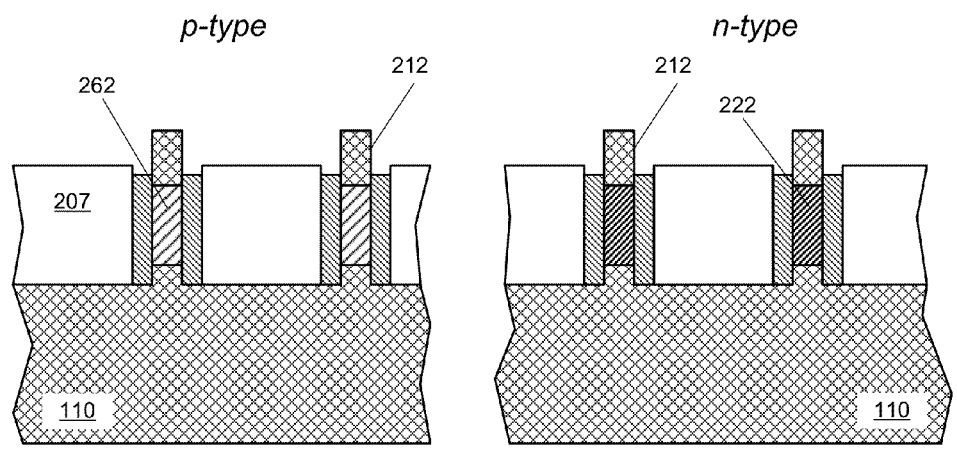
FIG. 2T depicts integration of n-MOS and p-MOS strained-channel, finFET devices onto a same substrate, according to some embodiments.

Although the acts described in FIGS. 2A-2S referred primarily to a Si/SiGe combination of materials, other combinations are possible. For example, in some embodiments, Si and SiC may be used. The SiC may be used to form the strain-inducing base structures 262 for p-type finFETs, as depicted in FIG. 2T. Additionally, both types of devices may be formed on a same substrate 110. The structures may be used to form CMOS finFETs, e.g., p-type devices using Si/SiC material combinations and n-type devices using Si/SiGe material combinations. The complementary devices may be formed at substantially a same device level on a substrate, or at different levels.

To investigate the amount of strain imparted to fins, numerical simulations utilizing finite element analysis were carried out. These computations show that strain in excess of 1 GPa can be imparted to channel regions of finFETs using the above-described fabrication techniques. Among the controlling parameters are lattice mismatch between the straining layer and substrate (controllable through choice of materials and/or dopant concentrations), thickness or height of the straining layer, thickness of the constraining layer and its Young's modulus, thickness or height of the fin, and length of the fin.

Figure 3:
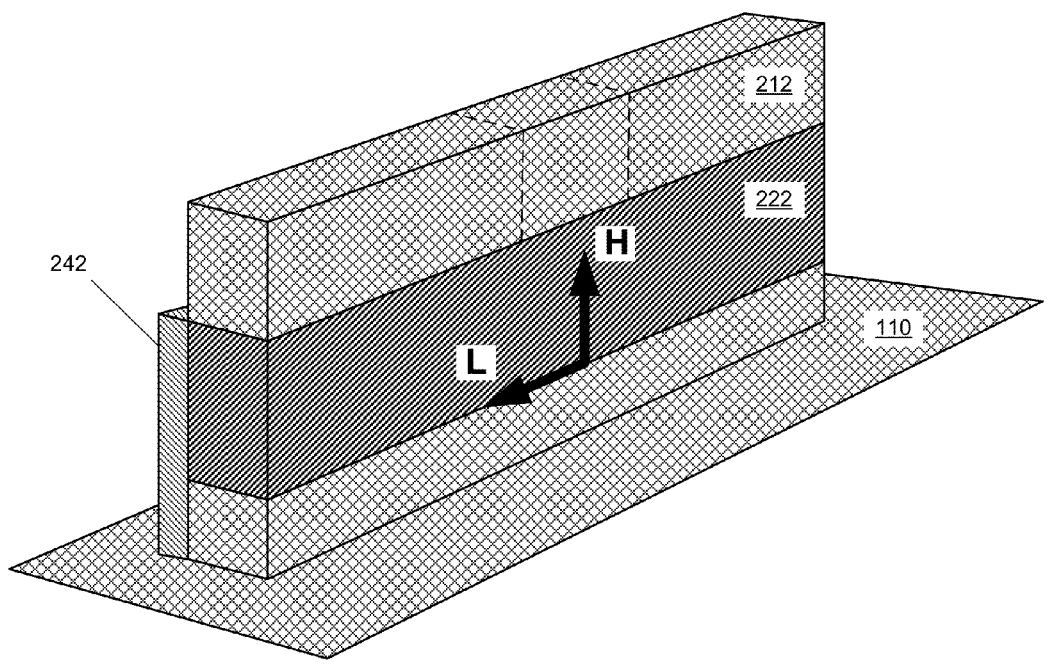
FIG. 3 is a perspective view of a strained fin structure, according to some embodiments.

FIG. 3 shows a perspective view of a fin structure in which longitudinal stress was numerically analyzed. For purposes of viewing the structure, one of the constraining structures 242 is omitted from the drawing, but was included in the simulations. The longitudinal stress $S_{yy}$ was computed along a length L of the fin from its center, and at various heights (in the direction of H) at the fin center. According to some embodiments, an active region or channel of a finFET would be located at the center of the fin 212, e.g., at the region between the dashed lines in FIG. 3.

Figure 4A:
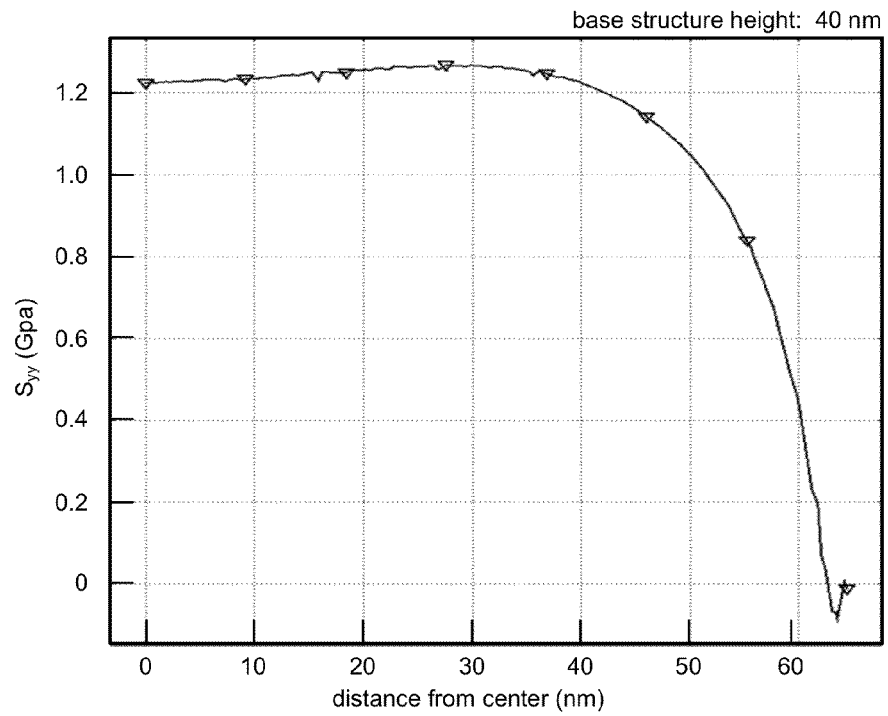
FIGS. 4A-4C shows plots of longitudinal stress computed along a length of a strained silicon seed-layer structure, starting from a mid-point of the structure's length. The different plots represent results for different heights of a SiGe strain-inducing base structure. The concentration of Ge in the strain-inducing base structure was 25%.
Figure 4B:
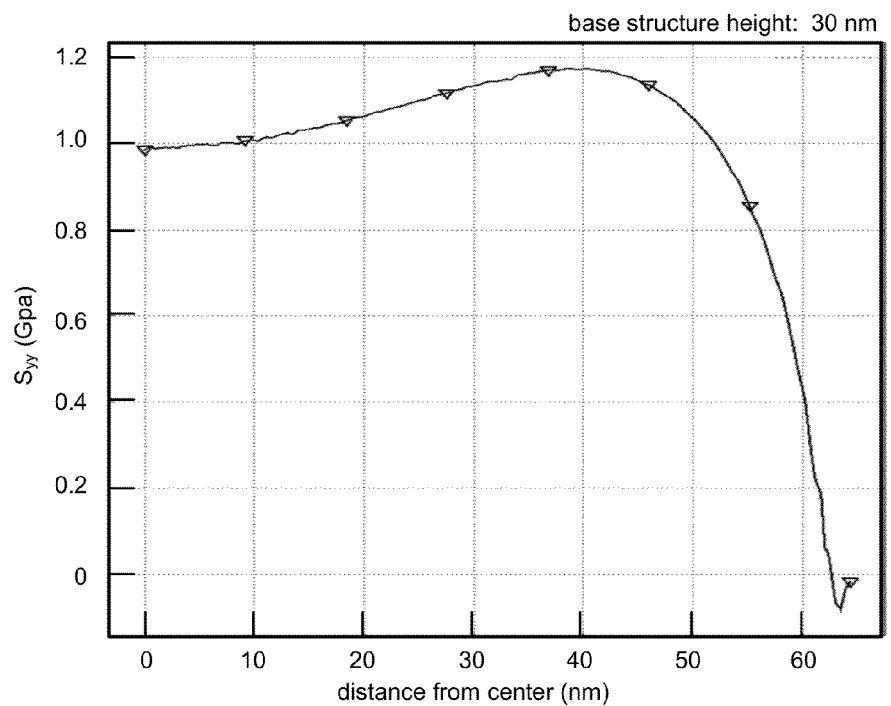
Figure 4C:
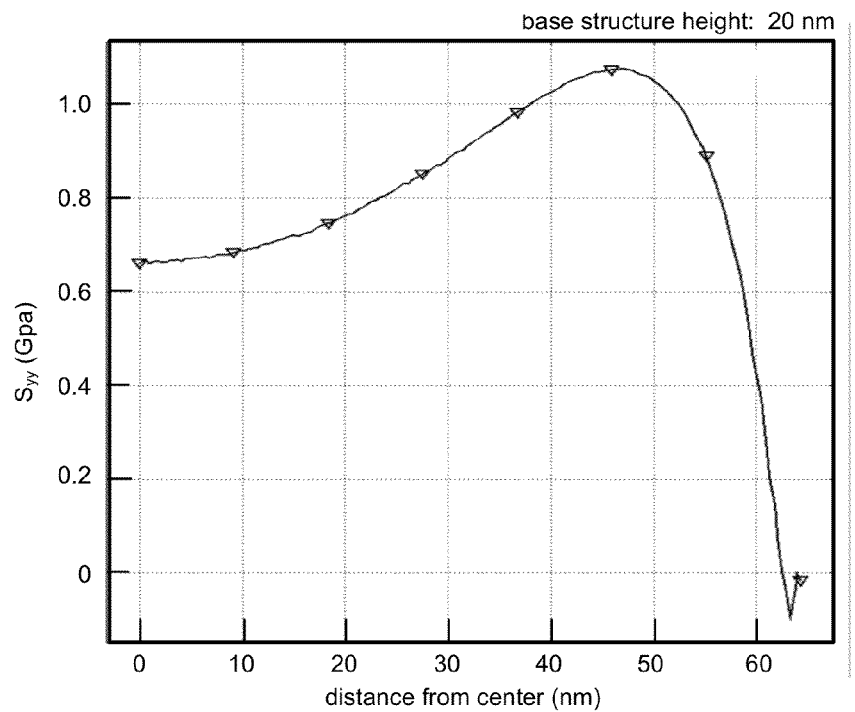
Figure 5A:
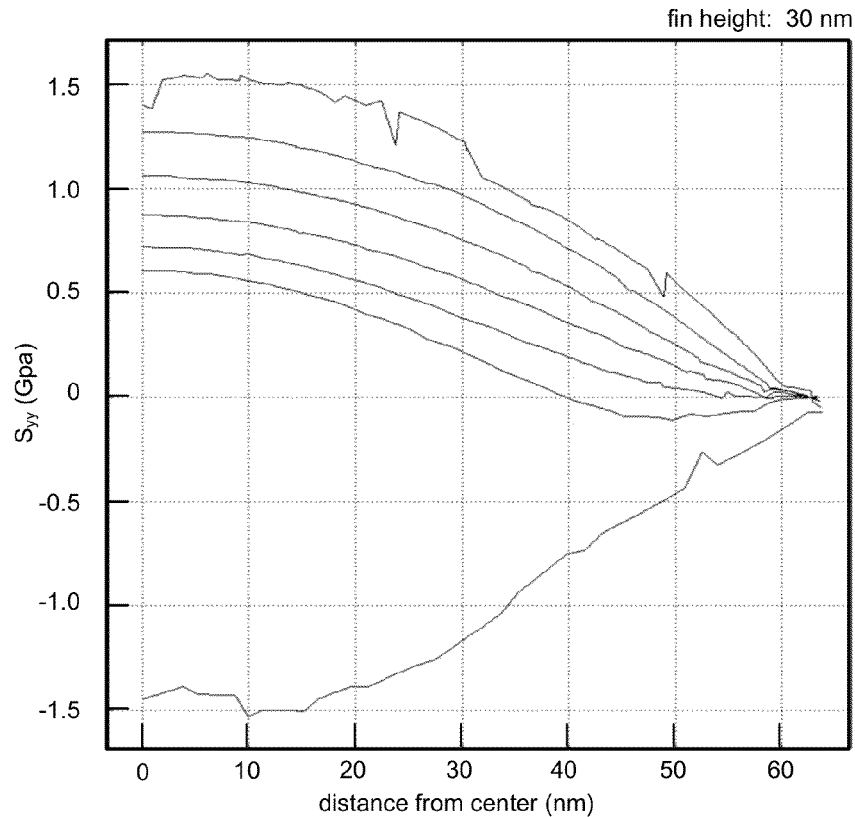
FIGS. 5A-5C show plots of longitudinal stress computed at different heights within a strained fin structure, for three different fin heights (30 nm, 20 nm, and 10 nm).
Figure 5B:
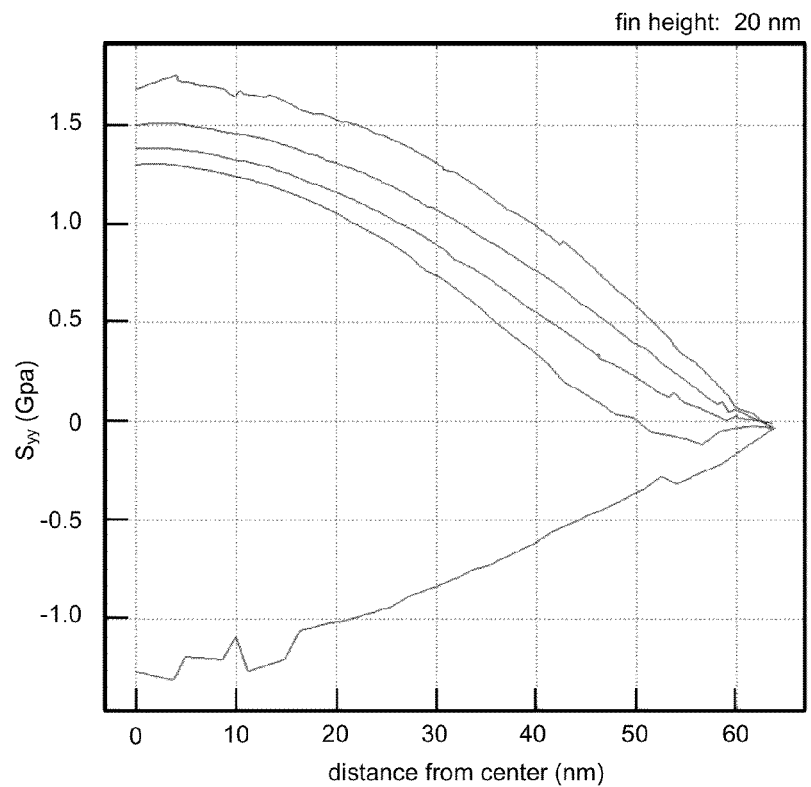
Figure 5C:
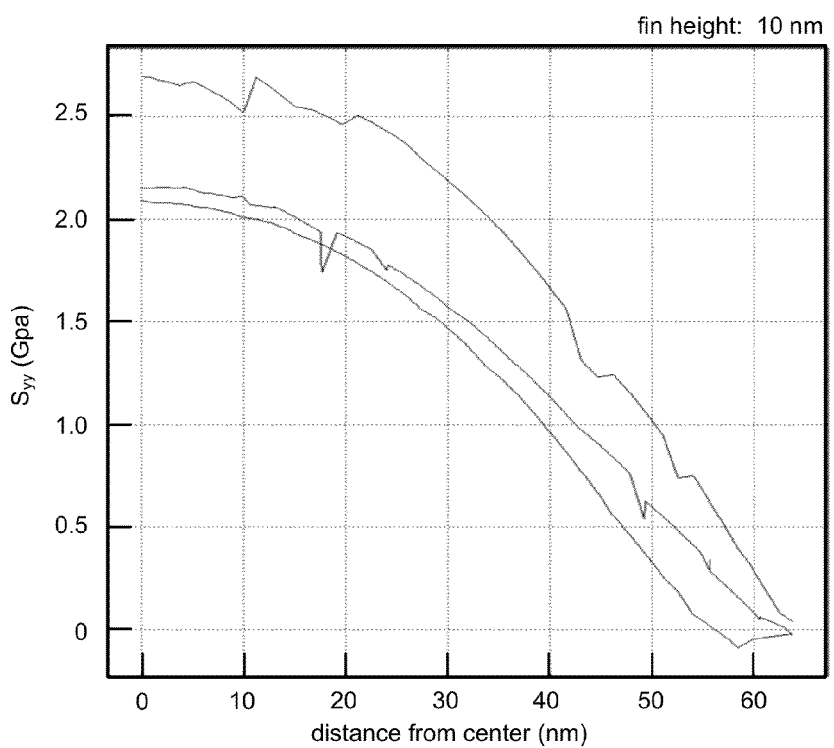

Two sets of simulations were run. In a first set, only the seed layer 210 was present above the strain-inducing base structure. The results from these simulations are shown in FIGS. 4A-4C. In the second set of simulations, a silicon fin 212 was regrown on the seed layer, and stress plots were generated for different heights within the fin. Three different fin heights were trialed in the second set of simulations. The results from these simulations are shown in FIGS. 5A-5C. In both sets, the thickness or height of the strain-inducing base structure was selected to be 40 nm, and the concentration of Ge in the SiGe base structure was selected to be about 25%. This concentration of Ge introduced about 1% strain in the SiGe layer. The length of the strain-inducing base structure 222 and fin 212 was selected to be about 128 nm for both sets of simulations. The transverse width of a fin was selected to be about 10 nm, and the thicknesses of the adjacent constraining structures were selected to be about 10 nm. The constraining material was selected to be $Si_3N_4$. The values selected for the simulations were chosen only for purposes of illustration, and are not meant to be limiting.

In the first set of simulations (FIGS. 4A-4C), the strain induced in the buffer layer 210 is found to be greater than 1.2 GPa at the midpoint (in terms of length) of the seed layer 210, for a strain-inducing base structure that is about 40 nm in height (FIG. 4A). The strain is tensile, indicating that the underlying SiGe, formed under compressive stress, has relaxed so as to place the Si buffer layer 210 under tensile stress. The strain increases moving toward an end of the fin, and then drops sharply within about 20 nm from the end of the fin. FIGS. 4B and 4C show that the strain at the center of the seed layer (a region where the channel of the finFET may be formed) falls to about 0.6 GPa when the height of the strain-inducing base structure 222 is reduced to about 20 nm.

Interestingly, for FIGS. 4B and 4C, there remain regions along the seed layer 210 where the induced strain remains above about 1 GPa. In some embodiments, channel regions of two separate finFETs may be formed at these high-strain regions on a single fin structure like that shown in FIG. 3. The two finFETs may share source connections at the center of the fin, for example, and separate drains may be located at opposing ends of the fin.

For the results shown in FIGS. 5A-5C, the height of the strain-inducing base structure 222 was fixed at about 40 nm. Other parameters of the base structure 222 were the same as used for FIGS. 4A-4C. The height of the regrown fins were selected to be 30 nm (FIG. 5A), 20 nm (FIG. 5B), and 10 nm (FIG. 5C). For each graph, several simulation results are provided for different height locations within the fin 212 (upper traces). The traces with the highest strain values reflect an amount of strain near the base of the fin 212, e.g., near the interface between the strain-inducing base structure 222 and fin 212. The traces immediately below the top trace reflect strain values at increasing heights in the fin.

FIG. 5A shows that for a 30-nm thick fin, the induced strain is about 1.5 GPa near the base and center of the fin, and that the induced strain reduces to about 0.6 GPa near the top of the fin. Again, the induced strain falls in value toward the end of the fin structure, but falls more gradually than for the structures simulated in FIGS. 4A-4C. The lower trace in FIG. 5A shows strain just inside the base structure.

FIGS. 5B-5C show that the strain increases, to more than 2.5 GPa, when the thickness of the fin reduces to about 10 nm (e.g., a nanowire dimension). As the figures show, high values of stress can be achieved for very thin layers of semiconductor materials. Further, because the layers are thin, e.g., less than about 60 nm in some embodiments, there may be no significant defect formation, since the materials are strained in the elastic regime. Accordingly, high-performance Si devices that may be competitive with alloy devices (e.g., SiGe or SiC devices) may be fabricated using the techniques described above.

Although the results shown in FIGS. 4A-4C and FIGS. 5A-5C were obtained from samples with uniform doping (25% Ge) in the straining layer 220, in some embodiments, it may be possible to increase the Ge content (or C content for a SiC straining layer) and/or increase the thickness of the straining layer beyond the amounts described before creating an unacceptable defect density. In some embodiments, a gradient in Ge (or C) content may be used to increase the thickness of the straining layer without creating an unacceptable defect density. The gradient in Ge (or C) may be in the direction of epitaxial growth, e.g., in a direction perpendicular to an interfacial surface between the straining layer 220 and the buffer layer 210. In some embodiments, the Ge (or C) content may be between about 10% and about 25% within the straining layer. In some embodiments, the Ge (or C) content may be between about 25% and about 50% within the straining layer.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins. The fins may have a width between approximately 5 nm and approximately 30 nm. The fins may be spaced apart between approximately 10 nm and approximately 50 nm, in some embodiments. In some embodiments, the fins may be spaced apart between approximately 50 nm and approximately 250 nm. According to some embodiments, the fin spacing or pitch may be between about 40 nm and about 60 nm. There may be one or more fins per finFET device. A gate structure, like that shown in FIG. 1B may be formed over one or more strained fins to form a finFET. For example, there may be a common gate shared by multiple strained fins.

A finFET device fabricated according to the present teachings may be formed in an integrated circuit in large numbers and/or at high densities. The circuits may be used for various low-power applications, including but not limited to, circuits for operating smart phones, computers, tablets, PDA's, video displays, and other consumer electronics. For example, a plurality of finFETs fabricated in accordance with the disclosed embodiments may be incorporated in processor or control circuitry used to operate one of the aforementioned devices.

The discussion above is directed primarily to a SiGe straining layer that imparts tensile stress to a fin of a Si finFET device. Accordingly, for a Si finFET, the use of SiGe for the straining layer may improve the electron mobility for n-channel finFETs. For p-channel finFETs, SiC may be used as the straining layer. SiC can impart compressive stress to a fin. In alternative embodiments for which an active fin and channel may be formed in SiGe, the materials may be reversed. For example, Si may be epitaxially grown on a SiGe substrate or base layer to form a straining layer of Si. The buffer layer and fin may then be formed of SiGe.

Although embodiments described above are directed to fabrication of strained-channel Si finFET devices, the methods of inducing strain may be extended to other devices or structures, in which other materials may be used. The techniques may be applied to other types of finFETs, e.g., fully insulated finFETs such as silicon-on-nothing finFETs, and other microfabricated devices and structures such as MEMs devices. In some embodiments, the techniques may be used in LEDs or laser diodes to strain the device and adjust emission wavelength. According to some embodiments, a straining layer and strain-inducing structure may be used to impart stress to any three-dimensional structure patterned into a device layer that has been formed adjacent the strain-inducing structure. For example, a three-dimensional device or structure may be formed adjacent a strain-inducing structure that is shaped for the particular device so as to impart strain to the three-dimensional device or structure.

In some embodiments, the straining layer and/or seed layer may comprise a material other than semiconductor material, e.g., crystalline insulator, an oxide, a ceramic, etc. In some embodiments, the straining layer and/or seed layer may be formed by methods other than epitaxial growth, e.g., plasma deposition, plasma deposition and annealing, sputtering, etc. followed by an anneal. According to some embodiments, a thin insulating layer, or a layer of a different material, may be formed between the straining layer and the seed layer. In some embodiments, at least a portion of the straining layer may comprise an active region or portion of a formed device.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A finFET comprising:
   a substrate;
   a strain-inducing base structure vertically above the substrate, the strain-inducing base structure comprising a first semiconductor material having a first lattice constant;
   a constraining material laterally adjacent the strain-inducing base structure, the constraining material having a Young's modulus higher than a Young's modulus of the strain inducing base structure; and
   a fin vertically above the strain-inducing base structure and comprising a second semiconductor material having a second lattice constant that is different than the first lattice constant.

2. The finFET structure of claim 1, wherein the first semiconductor material comprises SiGe or SiC.

3. The finFET structure of claim 2, wherein a Ge or C content of the SiGe or SiC is between approximately 10% and approximately 25%.

4. The finFET structure of claim 2, wherein a Ge or C content of the SiGe or SiC is between approximately 25% and approximately 40%.

5. The finFET structure of claim 2, wherein the first semiconductor material has a gradient in Ge or C concentration in a direction perpendicular to an interfacial surface between the strain-inducing feature and the fin.

6. The finFET structure of claim 1, wherein the second semiconductor material comprises Si.

7. The finFET structure of claim 1, wherein a thickness of the first semiconductor material is between approximately 10 nm and approximately 60 nm.

8. The finFET structure of claim 1, wherein a thickness of the second semiconductor material is between approximately 10 nm and approximately 60 nm.

9. The finFET structure of claim 1, wherein the fin has a width between approximately 5 nm and approximately 30 nm.

10. The finFET structure of claim 9, further comprising a gate structure formed at a center region of the fin.

11. The finFET structure of claim 10 disposed in a smart phone, computer, tablet computer, PDA, or video display.

12. The finFET structure of claim 1, wherein the Young's modulus of the constraining material is at least twice the value of the Young's modulus of the strain-inducing base structure.

* * * * *